United States Patent [19]

Hiroshima et al.

[11] 4,101,971

[45] Jul. 18, 1978

[54] MAGNETIC BUBBLE INFORMATION WRITING DEVICE

[75] Inventors: Minoru Hiroshima; Shigeru Yoshizawa; Nobuo Saito; Atsushi Asano; Hirokazu Aoki, all of Kokubunji, Japan

[73] Assignee: President of Kogyo Gijutsuin, Japan

[21] Appl. No.: 717,377

[22] Filed: Aug. 24, 1976

[30] Foreign Application Priority Data

Aug. 28, 1975 [JP] Japan .............................. 50/103498
Nov. 4, 1975 [JP] Japan .............................. 50/131446

[51] Int. Cl.$^2$ ........................................... G11C 19/08
[52] U.S. Cl. ....................................... 365/11; 365/33; 365/43
[58] Field of Search .................. 340/174 TF; 365/11, 365/12

[56] References Cited

PUBLICATIONS

IEEE Transactions on Magnetics, vol. MAG-9, No. 3; Sep. 1973, pp. 474–480.
IBM Technical Disclosure Bulletin, vol. 13, No. 11, Apr. 1971, p. 3297.
IBM Technical Disclosure Bulletin, vol. 15, No. 6, Nov. 1972, pp. 2017–2018.
IBM Technical Disclosure Bulletin, vol. 19, No. 4, Sep. 1976, p. 1413.

*Primary Examiner*—James W. Moffitt
*Attorney, Agent, or Firm*—Craig & Antonelli

[57] ABSTRACT

A magnetic bubble information writing device in which a conductor loop is disposed on the magnetic bubble propagation circuit and in which magnetic bubbles are generated by sending pulse current through the conductor loop, the device having a means which after having sent the bubble generating pulse current through the conductor loop, sends pulse current for annihilating stray bubbles through the same, the stray bubble annihilating pulse current having a polarity opposite to that of the bubble generating pulse current.

6 Claims, 9 Drawing Figures

ROTARY HOE STRIPPING MEANS

BACKGROUND OF THE INVENTION

The present invention relates to agricultural earthworking implements such as rotary hoes and more particularly, relates to an improved means for preventing trash from accumulating on hoe wheels during operation.

For many years earthworking implements utilizing tools such as rotary hoes have been used to cultivate and break up the soil crust close to young plants. To cultivate the fields after plowing or after planting, gangs of rotary hoes mounted on common shafts are often utilized.

Today as more farmers utilize chisel plowing rather than moldboard plowing, grass, plant roots and similar trash materials remain on the ground surface. Subsequently when the ground is cultivated with rotary hoes, the surface trash not turned under during chisel plowing is picked up on the wheel tines or wrapped around the hoe shaft.

To reduce trash buildup on rotary hoes and wheels, it has been common practice to position frame-mounted stripper fingers adjacent the rotary tine path whereat the trash can be stripped from the rotating tine members. While some of the trash buildup on the tines can be ripped off as the tines pass the stripper fingers, much of the trash pierced by the tines must be removed by pulling it from the tine. Further, a common type of trash buildup on rotary hoe gangs includes wrapping of grass and other similar materials about the hoe shaft. Stripper fingers will not minimize this type of trash buildup.

SUMMARY OF THE INVENTION

To overcome these problems applicant has provided a stripper means for continuously removing accumulations of trash from each hoe tine member and for preventing buildup of grassy-type trash on each hoe wheel shaft.

Accordingly, it is an object of the present invention to provide a stripper means for each hoe wheel which will remove trash accumulations continuously as they are encountered.

It is further an object to provide a stripping means which permits each rotary hoe wheel to operate independently of the adjacent rotary hoe wheel.

Another object includes the provision of a hoe wheel stripping means which will aid in preventing structural damage encountered by the hoe wheel as solid objects such as rocks and stumps are encountered during operation.

And finally it is an object to provide a simple and inexpensively manufactured and maintained stripper means which can be adapted to existing hoe wheels currently in operation.

DESCRIPTION OF THE PREFERRED EMBODIMENT

Figure 1:
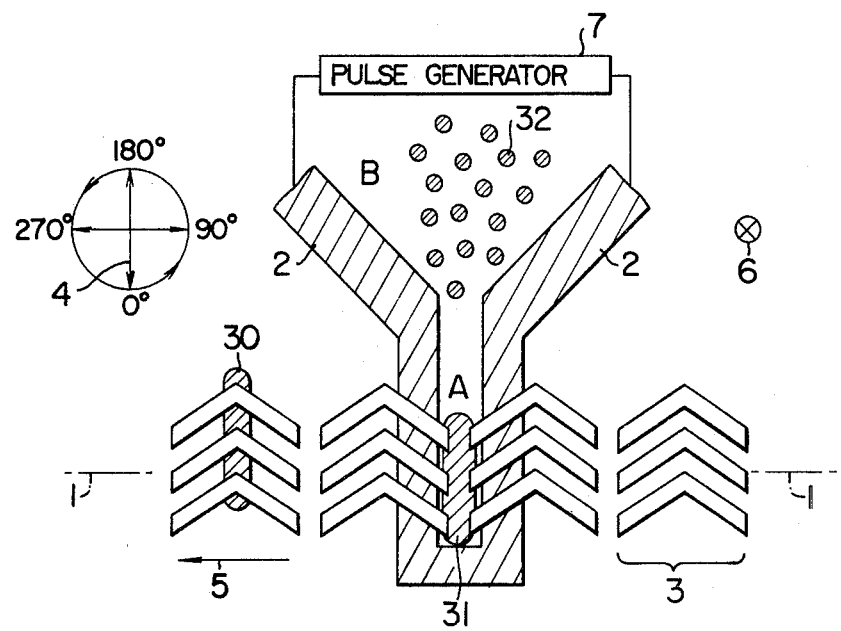
FIG. 1 is a side view of an implement utilizing rotary hoes and stripping means constructed in accordance with the principals of the present invention.

A rotary hoe constructed in accordance with the principals of the present invention is indicated generally in the drawings by the numeral 10 and is illustrated in FIG. 1 as being attached to a conventional tractor 12. The rotary hoe 10 is carried on an elongated toolbar 14 extending transversely to the normal direction of movement of the rotary hoe 10. An upstanding mast member 16 is secured to the center of the forward side of the toolbar 14 and is connected with the compression link 16 of the tractor three-point hitch. A pair of lower hitch pins 18 are carried by the forward side of the toolbar for connection with the lower draft links of the tractor three-point hitch.

A plurality of transversely spaced rearwardly extending support arms 20 have their forward ends pivotally connected with a pivot shaft 22 carried at the lower rearward corner of the toolbar 14. The support arms 20 are maintained in a spaced apart relationship by spacer bushings, not shown, positioned on the pivot shaft 22. The pivot shafts 22 are supported from the toolbar by mounting straps 24 secured to the toolbar by bolts 26.

The support arms 20 extend rearwardly and downwardly from the toolbar pivot shaft 22. The forward ends of the arms 20 extend slightly forward of the pivot shaft 22 and serve as stop means that abut against the lower side of the toolbar 14 to limit the downward movement of the lower ends of the arms.

A walker arm 28 is pivotally mounted at the lower end of each support arm 20 and a pair of front and rear rotary hoe wheels 10 are journaled on the ends of each walker arm 28. The rotary hoe wheels 10 are of well-known construction, each having a plurality of generally radially extending tines 30 with outer tips extending slightly forwardly with respect to the direction of rotation. The front and rear wheels 10 are mounted on opposite sides of the walker arms 28 so that the hoe wheels 10 are spaced apart laterally.

A downward force is applied on each support arm 20 by a helical torsion spring 32. Each biasing means or spring 32 is wrapped about a bushing adjacent the support arm 20 and has one free end in engagement with the toolbar 14 and the other free end bent to form a hook which engages the associated support arm 20.

Each rotary hoe wheel 10 is comprised of a central hub section 34 having a plurality of radially extending tine members 30 attached thereto. The tine members 30 of each wheel are secured in an equally angularly spaced relation to one another by being riveted, as at 31, to annular rib members 36 on opposite sides of the tines. The rib members 36 are concentric with and spaced radially outwardly with respect to the hub 34.

Tine stripping means 38 for each wheel 10 is comprised of two annular rings 40, each placed in substantially parallel vertical planar disposition. The rings 40 are positioned alongside and on opposite sides of respective hoe wheels 10 and are coupled together by S-shaped hooks 42 projecting between adjacent tine members 30. The stripper rings 40 are of a larger diameter than the annular rib member 36, but of smaller diameter than the rotary hoe wheel 10. The S-shaped hooks 42 secure the stripping rings 40 in place and couple the stripper rings 40 for rotation with their respective rotary hoe wheels 10. The S-shaped hooks 42 joining the stripper rings 40 are loosely connected thereto to permit relative movement of the rings 40 during operation.

During operation when the rotary hoe 10 is in a working position, the arrangement of the support arms 20 and biasing means 32 provide a substantially constant downward force on each pair of hoe wheels 10 for any given vertical position of the hoe wheels with respect to the toolbar. Thus, during use the reaction between the hoe wheels and the soil creates a force which tends to rock the walker arms 28 in a counterclockwise direction as viewed in FIG. 1. Consequently, the loosely fitting stripper rings 40 will ride over the surface of the soil being worked and the undersides thereof will be forced radially inwardly with respect to the tines 30 until the S-hook 42 contacts the rib member or abutment means 36 of the rotary hoe wheel 10. At the same time the upper sides of the rings 40 will be forced radially outwardly with respect to the tines 30. As the rotary hoe wheel 10 is advanced across the field, the stripper rings 40 will continue to be pressed against the rib member 36 at a point directly below the hoe shaft 44. As trash and dirt are accumulated on the tine members 30 during cultivating operation, the remainder and particularly the upper sides of the stripper rings 40 will slidably push the accumulation radially outwardly along that particular tine 30 as the wheel rotates to remove or strip the trash from the tine 30. The stripper rings 40 are connected by the S-shaped hooks 42 which extend between the adjacent tine members to assure rotation of the ring members 40 with the wheel 10. Because the rings 40 rotate with the wheel, the action of the ring relative to any particular tine as the wheel rotates is a reciprocable action along the radius of the tine thus stripping any material buildup radially outwardly along the tine to remove it therefrom during rotation.

Each rotary hoe wheel 10 is provided with its own stripper ring means 38 to assure that that wheel remains clean during operation. Each rotary hoe wheel is also mounted on its own shaft 44 rather than a common shaft for a gang of rotary hoe wheels to prevent buildup of grass and other long trash material on the common shaft.

Figure 4:
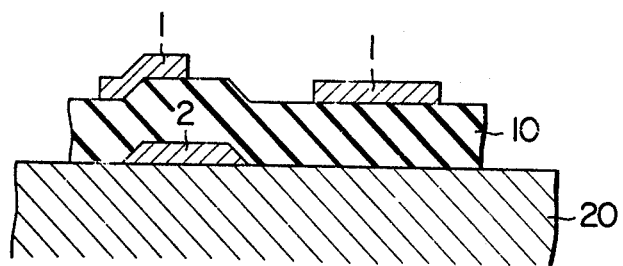
FIG. 4 is an expanded side view of an alternate embodiment utilizing the present invention.
Figure 5:
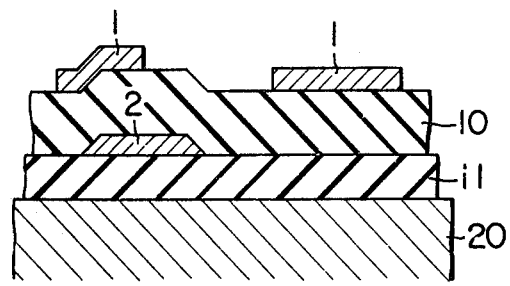
FIG. 5 is an end view of the hoe illustrated in FIG. 4.

An alternate embodiment is illustrated in FIGS. 4 and 5 wherein the hub 34 provides the abutment means or minimum radius to which the stripper rings can be moved and a single stripper ring is threaded behind alternate tine members. In this embodiment, the hub 34 serves to limit the movement of the stripping means 38 as the annular rib 36 does in the preferred embodiment illustrated in FIG. 1. A single stripping ring 46 is utilized in this alternate embodiment and operates as does the preferred pair of rings 40 shown in FIG. 1. The single ring 46 is woven between tine members 30 as illustrated in the end view of FIG. 5 and will slide but will not rotate relative to the hoe wheel 10 as will the preferred embodiment. Since the stripper rings 40 or 46 during operation of the rotary hoe wheel provide to some degree a limitation upon the penetration of the rotary hoe tines, the radius of the rib member 36 or hub member 34 as illustrated in FIG. 4 will define the amount of tine penetration possible. Should the operator prefer to limit the penetration of the tine members 30, flat ring members could be substituted for the bar-type ring members 40 illustrated in the drawings of the preferred embodiment.

From the foregoing, it can be seen that the present invention provides a rotary hoe wheel and stripper means which can be satisfactorily used in extremely trashy or normal field conditions.

I claim:

1. A rotary hoe wheel of the type having a central hub member and a plurality of radially extending tine members secured to the hub, the improvement residing in a tine cleaning means comprising: a separate ring member closely adjacent each side of the wheel, the diameter of said ring members being equal to or less than the wheel; and means loosely coupling the ring members together for limited movement relative to one another, for rotation with the wheel and for radial sliding movement along the tine members in substantial unison.

2. The invention defined in claim 1 wherein the means loosely coupling the ring members together is a plurality of S-shaped hooks.

3. The invention defined in claim 1 wherein the hoe wheel is further characterized by the provision of an annular rib member securing the tine members in place, said rib member having a diameter in excess of that of the hub, but smaller than that of the ring member.

4. A rotary hoe wheel as set forth in claim 1, and wherein the means coupling the ring members further includes an abutment surface engageable with the hub member to limit radial movement of the ring member.

5. A rotary hoe wheel comprising: a central hub member; a plurality of radially extending tine members secured to the hub; a separate ring member disposed closely adjacent each side of the wheel and having a diameter equal to or less than the wheel; and means loosely coupling the ring members together for limited relative movement, for rotation with the wheel and for radial sliding movement along the tine members in substantial unison, said means including an abutment surface extending between adjacent tine members are engageable with the tine members to limit rotational movement of the ring members relative to the wheel.

6. The invention defined in claim 5 wherein the coupling means includes a plurality of S-shaped hooks connected with each ring and extending between adjacent tine members.

7. A rotary hoe wheel comprising: a central hub; a plurality of radially extending tine members secured to the hub; and a tine cleaning means including a pair of annular ring members having a diameter equal to or smaller than the wheel, said ring members disposed closely adjacent opposite sides of the tine members; and means loosely coupling said ring members together for limited movement relative to one another, for rotational movement with the wheel and for radial sliding movement along the tine members in substantial unison, said means further including an abutment surface disposed between adjacent tine members and engageable with the tine members and hub to limit radial and rotational movement of the ring members relative to the wheel.

8. The invention defined in claim 7 wherein the means coupling the ring members is a plurality of S-shaped hooks connected with each ring member and disposed between adjacent tine members.

9. A rotary hoe wheel having a central hub; a plurality of radially extending tine members angularly spaced about and attached to said hub; and an improved tine cleaning means including a pair of annular ring members having a diameter equal to or smaller than the wheel, one ring member disposed closely adjacent each side of the tine members, and a plurality of hooks loosely coupling the ring members together for limited interval from the cease of the bubble generating pulse current to the initiation of the stray bubble annihilating pulse current is indicated by $\theta'_a$ (represented by the angle through which the rotating magnetic field rotates during the time interval).

Figure 6:
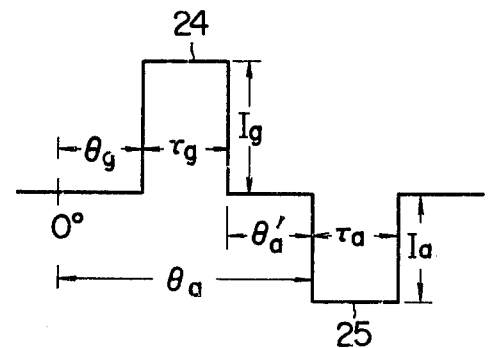

The operation of a magnetic bubble information writing device using such a magnetic bubble propagation circuit (FIGS. 3 and 4) and pulse currents (FIG. 6) as described above, under the influence of a rotating magnetic field of 100 kHz, will be described below.

Figure 7:
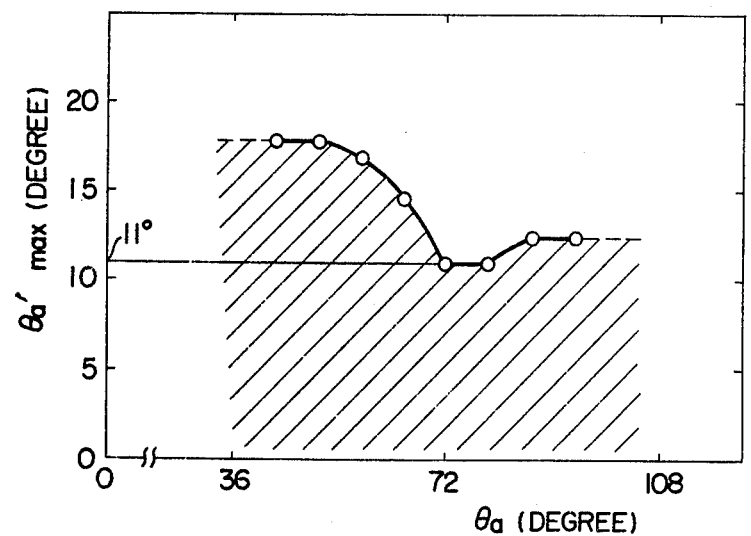

FIG. 7 shows an example of an experiment made to obtain the condition on pulse currents which meet the requirement (1) given above for the magnetic bubble information writing device according to this invention. It is conventionally believed that in order to completely annihilate a magnetic stray bubble before it gets out of the conductor loop, the interval $\theta'_a$ from the cease of the bubble generating pulse current to the initiation of the stray bubble annihilating pulse current should be got as small as possible. The experiment has revealed that there exists the maximum value $\theta'_a$ max in $\theta'_a$ and that if the value of $\theta'_a$ is set smaller than $\theta'_{a\,max}$, the requirement (1) can be fully satisfied. FIG. 7 shows the variation of $\theta'_a$ max with the changing values of the timing $\theta'_a$ of the stray bubble annihilating pulse current. The hatched area in the graphical representation in FIG. 7 corresponds to the region where the above requirement (1) is satisfied. This result has been obtained by maintaining the pulse amplitudes $I_g$ and $I_a$ and the pulse widths $\tau_g$ and $\tau_a$ at 330 mA, 300 mA, 250 nsec and 300 nsec, respectively. Even in the case, however, where $I_a$ and $\tau_a$ as well as $I_g$ and $\tau_g$ are varied, the same result as shown in FIG. 7 has been obtained, the values of $\theta'_{a\,max}$ being independent. Thus, it has become clear that the maximum value $\theta'_{a\,max}$ are characteristic of the magnetic bubble information writing device and especially determined by the geometrical configuration of the conductor loop. And in case of the embodiment shown in FIG. 7, the requirement (1) will be fully satisfied if $\theta'_a$ does not exceed 11°.

Figure 8:
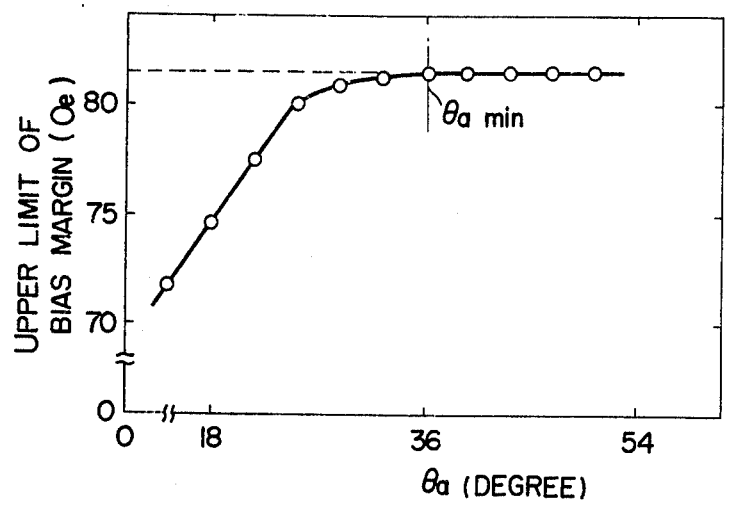

FIG. 8 shows an example of another experiment made to obtain the condition on pulse currents which meet the requirement (2) given above. In the case where the stray bubble annihilating pulse current is sent as soon as possible (within 11°) after the cease of the bubble generating pulse current, there is a possibility that the magnetic bubble 31 generated in the propagation circuit 1 by the bubble generating pulse current is also annihilated by the stray bubble annihilating pulse current. Accordingly, the upper limit of the margin of the bias field when the stray bubble annihilating pulse current is sent through the conductor loop, is considered to be lower than when the stray bubble annihilating pulse current is not supplied. The experiment has revealed that the upper limit of the margin of the bias magnetic field is largely affected by the timing $\theta_a$ at which the stray bubble annihilating pulse current is started to flow, but that the upper limit remains constant when $\theta_a$ exceeds a certain threshold value $\theta_{a\,min}$, the requirement (2) being fully satisfied. FIG. 8 shows how the upper limit of the bias field margin varies with the changing values of the timing $\theta_a$ at which the stray bubble annihilating pulse current is started to flow.

The dashed line corresponds to the case where the stray bubble annihilating pulse current is not sent. This result has been obtained by maintaining the other parameters of the pulse currents such that $\theta_g$ = 250 nsec, $I_g$ = 330 mA, $\theta_a$ = 300 nsec and $I_a$ = mA. Especially, the interval $\theta'_a$ is, in this case, set at 5° for which the requirement (1) described with FIG. 7 is fully satisfied. However, even when the values of the parameters were variously changed, it turned out that the same result as shown in FIG. 8 was obtained independently of the change in the values of the parameters. Therefore, the value $\theta_{a\,min}$ is considered to be characteristic of the magnetic bubble information writing device and especially to be determined by the geometric configuration of the pattern of the propagation circuit. In case of the embodiment as shown in FIG. 8, the requirement (2) will be fully satisfied by setting $\theta_a$ larger than $\theta_{a\,min}$ (= 36°).

The conclusion obtained above is interpreted as follows. When the phase of the rotating magnetic field exceeds $\theta_{a\,min}$, the magnetic bubble generated by the bubble generating pulse current is propagated completely out of the conductor loop so that the bubble is not annihilated by the stray bubble annihilating pulse current as soon as the bubble generating pulse current ceases.

In sum, the timing of the bubble generating pulse current flowing in terms of the phase angle of the rotating magnetic field must be greater than $\theta_{a\,min} - \theta'_{a\,max}$, with the pulse width neglected for simplicity's sake. The reason for this is that the generated bubble is propagated immediately to the position corresponding to the then assumed instantaneous phase of the rotating magnetic field as soon as the bubble generating pulse current has vanished. The timing in terms of the phase angle of the rotating field at which the bubble generating current flows (more strictly, it ceases to flow) must be smaller than a certain maximum value $(\theta_g + \tau_g)_{max}$ within which a generated bubble can exist stably, the maximum value being 100° for the device described above. Accordingly, the timing in terms of the phase angle of the rotating field at which the stray bubble annihilating pulse current is started to flow, has also an upper limit and if the stray bubble annihilating pulse is started to flow in a phase angle region not exceeding this upper limit, the useful bubble as information is never annihilated, even when the stray bubble annihilating pulse current is sent out immediately after the bubble generating pulse current.

The summary of the foregoing is as follows. The condition for the phase current to fully satisfy the requirement (1) is that $$0 < \theta'_a \leq \theta'_{a\,max} \quad (1)$$

and the condition for the pulse current to fully satisfy the requirement (2) is that $$\theta'_{a\,max} + (\theta_g + \tau_g)_{max} \geq \theta_a \geq \theta_{a\,min} \quad (2)$$

The values $\theta'_{a\,max}$, $\theta_{a\,min}$ and $(\theta_g + \tau_g)_{max}$ are all characteristic of the device so that they are determined if only the specification of the device is determined. Namely, the inequalities (1) and (2), which are for restricting the timing of the stray bubble annihilating pulse current, have no correlation to each other, that is, they are independent on each other. If therefore is easy to manage the conditions for the pulse currents in such a manner that the two inequalities above are simultaneously satisfied.

The feature of this invention is that pulse currents capable of satisfying the above inequalities (1) and (2) are sent through the conductor loop while the above described characteristic of the magnetic bubble information writing device is utilized. An electric circuit for generating such pulse currents can easily be realized by combining a positive and a negative pulse generators triggered by clock pulses in such a manner that their outputs are synthesized.

As described above, according to the magnetic bubble information writing device embodying this invention, even if stray bubbles are generated, they can be completely annihilated by the stray bubble annihilating pulse current while the stray bubble annihilating pulse current exerts no influence on the bubble in the propagation circuit. Consequently, the lower limit of the bias field margin when the stray bubble annihilating pulse current is sent through the conductor loop, is never higher than that attained by the bias field margin when the stray bubble annihilating pulse current is not sent. Moreover, there is no lowering of the upper limit as described with FIG. 8 and the margin becomes broad.

Figure 2:
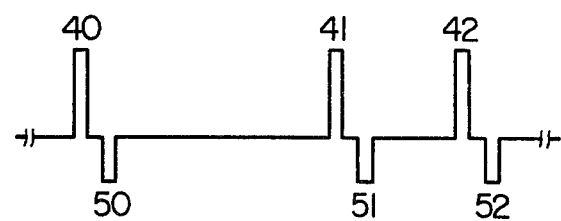
FIG. 2 is an expanded side view of the rotary hoe wheel illustrated in FIG. 1.
Figure 9:
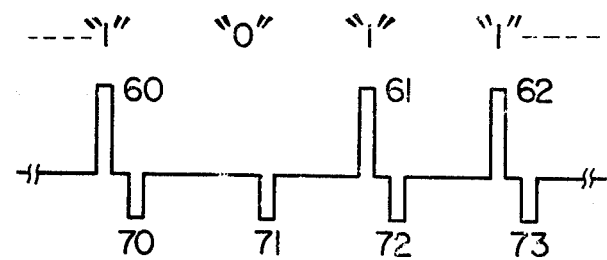

FIG. 9 shows another example of the waveforms of pulse currents sent through the conductor loop, used in the magnetic bubble information writing device according to this invention. The information pattern in FIG. 9 is the same as that in FIG. 2, i.e. . . . 1 0 1 1 . . . . In FIG. 9, reference numerals 60 – 62 indicate bubble generating pulse currents to be sent out in accordance with the information pattern "1", these pulse currents being the same as those in the previous embodiment. In this embodiment, however, the stray bubble annihilating pulse currents 70 – 73 are sent out even for the information pattern "0" as well as for "1". In this case, too, the stray bubbles are annihilated in the same manner as in the previous embodiment. The stray bubble annihilating pulse current 71 flows through the conductor loop 2 when there is no stray bubble so that this pulse 71 is superfluous for the purpose of annihilating stray bubbles. However, since the stray bubble annihilating pulse currents can be generated periodically independently of the difference between the information patterns "1" and "0", the electric circuit for generating the stray bubble annihilating pulse current can be simplified.

Figure 3:
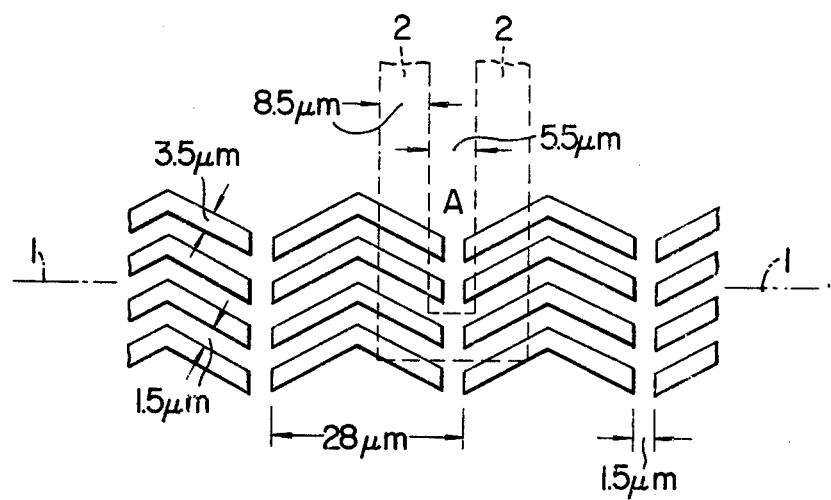
FIG. 3 is an end view of the rotary hoe illustrated in FIG. 2.

It should be noted that this invention has hitherto been described as applied to the magnetic bubble information writing device using the propagation circuit and conductor loop having such configurations as shown in FIGS. 3 or 4 but that this invention can similarly be applied also to other examples where the propagation circuit and the conductor loop take different configurations.

We claim:

1. A magnetic bubble information writing device comprising
a thin film of magnetic substance having uniaxial anistropy;
an insulating film disposed on said thin magnetic film;
a magnetic bubble propagation circuit made of soft magnetic substance and disposed on said insulating film;
a conductor loop so disposed between said thin magnetic film and said insulating film as to be opposite to a portion of said propagation circuit with said insulating film interposed therebetween;
means for applying to said thin film of magnetic substance having uniaxial anistropy a dc bias magnetic field perpendicular to said thin film;
means for applying to said propagation circuit a rotating magnetic field parallel to said propagation circuit; and
means for sending through said conductor loop a magnetic bubble generating pulse current and a stray bubble annihilating pulse current subsequent to said magnetic bubble generating pulse current and having a polarity opposite to that of said bubble generating pulse current,
wherein the timing of said bubble generating pulse current, expressed in terms of the phase angle of said rotating magnetic field, is smaller than a first predetermined limiting value within which a magnetic bubble generated in said thin magnetic film by said bubble generating current can exist stably, said first predetermined limiting value being determined by the pattern of said propagation circuit;
wherein the time from termination of said bubble generating pulse current to start of said stray bubble annihilating pulse current is shorter than the time required for the stray bubble generated inside said conductor loop but not on said propagation circuit to be propagated out of said conductor loop, said time being determined by the pattern of said conductor loop; and
wherein the timing of said stray bubble annihilating pulse current, expressed in terms of the phase angle of said rotating magnetic field, is greater than a second predetermined limiting value beyond which a magnetic bubble generated by said bubble generating pulse current and existing on said propagation circuit is propagated so far from said conductor loop that said magnetic bubble can no longer be annihilated by said stray bubble annihilating pulse current sent through said conductor loop, said second predetermined limiting value being determined by the pattern of said propagation circuit.

2. A magnetic bubble information writing device as claimed in claim 1, wherein a pulse of said stray bubble annihilating pulse current is sent through said conductor loop per bit of information, independently of whether there is a pulse of said bubble generating pulse current or not.

3. A magnetic bubble information writing device as claimed in claim 1, wherein an additional insulating film is provided between said conductor loop and said thin magnetic film.

4. A magnetic bubble information writing device as claimed in claim 3, wherein a pulse of said stray bubble annihilating pulse current is sent through said conductor loop per bit of information, independently of whether there is a pulse of said bubble generating pulse current or not.

5. In a magnetic bubble information writing device of the type including a thin film of magnetic substance having uniaxial anistropy; an insulating film disposed on said thin magnetic film; a magnetic bubble propagation circuit made of soft magnetic substance and disposed on said insulating film; a conductor loop so disposed between said thin magnetic film and said insulating film as to be opposite to a portion of said propagation circuit with said insulating film interposed therebetween; first means for applying to said thin film of magnetic substance having uniaxial anisotropy a dc bias magnetic field perpendicular to said thin film; second means for applying to said propagation circuit a rotating magnetic field parallel to said propagation circuit; and third means for applying to said conductor loop a magnetic bubble generating pulse current, wherein both information magnetic bubbles and unwanted stray magnetic bubbles may be generated, the improvement comprising said third means subsequently applying to said conductor loop a stray magnetic bubble annihilating pulse current having a polarity opposite to that of said bubble generating pulse current for annihilating said stray magnetic bubbles without affecting said information magnetic bubbles.

6. A magnetic bubble information writing device as claimed in claim 5, wherein said third means applies said stray magnetic bubble annihilating pulse current at a subsequent time interval after termination of said magnetic bubble generating pulse current which is shorter than the time for a stray magnetic bubble to enter said propagation circuit, and wherein said respective magnetic bubble generating pulse current and stray magnetic annihilating pulse current are applied to said conductor loop in a first predetermined time interval in which a given information magnetic bubble can be generated and after expiration of a second predetermined time interval such that said given information cannot be annihilated.

* * * * *